(12) United States Patent
Onzuka et al.

(10) Patent No.: US 10,818,532 B2
(45) Date of Patent: Oct. 27, 2020

(54) SUBSTRATE PROCESSING APPARATUS

(71) Applicant: Tokyo Electron Limited, Tokyo (JP)

(72) Inventors: Keiji Onzuka, Koshi (JP); Kouki Murakami, Koshi (JP); Hirozumi Hoshino, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/834,427

(22) Filed: Dec. 7, 2017

(65) Prior Publication Data

US 2018/0166310 A1 Jun. 14, 2018

(30) Foreign Application Priority Data

Dec. 9, 2016 (JP) ................................. 2016-239671

(51) Int. Cl.
*H01L 21/677* (2006.01)
*H01L 21/68* (2006.01)
(Continued)

(52) U.S. Cl.
CPC .......... *H01L 21/67766* (2013.01); *B08B 3/04* (2013.01); *B08B 3/047* (2013.01); *H01L 21/67057* (2013.01); *H01L 21/67086* (2013.01); *H01L 21/67173* (2013.01); *H01L 21/67718* (2013.01); *H01L 21/67742* (2013.01); *H01L 21/67754* (2013.01); *H01L 21/67757* (2013.01); *H01L 21/67778* (2013.01); *H01L 21/67781* (2013.01); *H01L 21/68* (2013.01);
(Continued)

(58) Field of Classification Search
CPC ......... H01L 21/67086; H01L 21/67023; H01L 21/67057; H01L 21/67718; H01L 21/67766; H01L 21/67742; H01L 21/67778; H01L 21/67781; H01L 21/681
See application file for complete search history.

(56) References Cited

U.S. PATENT DOCUMENTS

| 4,775,281 A * | 10/1988 | Prentakis | ............... B23Q 7/048 |
| | | | 118/500 |
| 6,247,245 B1 * | 6/2001 | Ishii | .................. H01L 21/67757 |
| | | | 34/210 |

(Continued)

FOREIGN PATENT DOCUMENTS

| JP | 2015-056631 A1 | 3/2015 |
| JP | 2015056631 A * | 3/2015 |
| JP | 2018-056339 A | 4/2018 |

OTHER PUBLICATIONS

Japanese Office Action (with English translation), Japanese Application No. 2016-239671, dated Aug. 25, 2020 (6 pages).

*Primary Examiner* — Gerald McClain
(74) *Attorney, Agent, or Firm* — Burr & Brown, PLLC

(57) ABSTRACT

A substrate processing apparatus includes a processing section that performs a batch process to a plurality of substrates. A first substrate transport mechanism removes one of substrates contained in a substrate container placed on a stage, and transport the substrate to a position adjusting unit, in which the position of the substrate in the rotating direction of the substrate is adjusted, and transports the substrate back to the substrate container. Then a second substrate transport mechanism collectively removes from the substrate container the substrates whose positions in the rotating direction have been adjusted by the position adjusting unit.

13 Claims, 7 Drawing Sheets

(51) Int. Cl.
*H01L 23/544* (2006.01)
*B08B 3/04* (2006.01)
*H01L 21/67* (2006.01)
*H01L 21/687* (2006.01)
*B08B 3/08* (2006.01)

(52) U.S. Cl.
CPC ...... *H01L 21/681* (2013.01); *H01L 21/68707* (2013.01); *H01L 23/544* (2013.01); *B08B 3/08* (2013.01); *H01L 2223/54426* (2013.01); *H01L 2223/54493* (2013.01)

(56) References Cited

U.S. PATENT DOCUMENTS

| | | | |
|---|---|---|---|
| 8,033,288 B2* | 10/2011 | Shiomi | H01L 21/67075 134/157 |
| 8,079,797 B2* | 12/2011 | Tanaka | H01L 21/67276 414/222.02 |
| 10,734,266 B2 | 8/2020 | Miyamoto | |
| 2002/0038164 A1* | 3/2002 | Osaka | H01L 21/67276 700/213 |
| 2003/0164179 A1* | 9/2003 | Kamikawa | H01L 21/67781 134/25.4 |
| 2009/0010748 A1* | 1/2009 | Kamikawa | H01L 21/67718 414/796.4 |
| 2009/0053021 A1* | 2/2009 | Yamagishi | H01L 21/67259 414/222.02 |
| 2010/0068014 A1* | 3/2010 | Mitsuyoshi | B65G 49/061 414/225.01 |
| 2018/0090360 A1* | 3/2018 | Miyamoto | H01L 21/68 |

\* cited by examiner

SUBSTRATE PROCESSING APPARATUS

CROSS REFERENCE TO RELATED APPLICATIONS

This application is based upon and claims the benefit of priority from Japanese Patent Application No. 2016-239671, filed on Dec. 9, 2016, the entire contents of which is incorporated herein by reference.

FIELD OF THE INVENTION

The present invention relates to a substrate processing apparatus that performs a batch process to a plurality of substrates.

BACKGROUND ART

Recently, an integrated circuit having a multilayered structure such as 3D-NAND has been put into practical use. In the manufacturing process such a circuit, a phenomenon of warpage of a semiconductor wafer (i.e., a substrate) having a specific positional relationship with respect to the alignment notch is recognized.

An example of a batch type substrate processing apparatus is a cleaning apparatus that cleans a plurality of, e.g., fifty substrates, by immersing the substrates into a process liquid stored in a processing tank while the substrates being held by a substrate holding device (e.g. a substrate guide) in upright postures and being arrayed horizontally. In order to improve throughput of the batch type substrate processing apparatus, substrates contained in two FOUPs (i.e., substrate containers) each containing twenty five substrates arranged at predetermined pitches are combined so as to form a batch consisting of fifty substrates arranged at half pitches, and the substrates forming the batch are collectively subjected to a liquid treatment (see, JP2015-056631A, for example).

In a case where the aforementioned warped substrates are handled in a batch type substrate processing apparatus, when the substrates in the substrate container are going to be collectively removed, there is a possibility that an arm of a substrate transport apparatus cannot be inserted into the space between adjacent substrates, and thus the substrates cannot be removed from the substrate container.

SUMMARY OF THE INVENTION

The object of the present invention is to provide a technique that enables a collective transport of a plurality of substrates, even in a case where warped substrate are handled in a batch type substrate processing apparatus.

In one embodiment of the present invention, there is provided a substrate processing apparatus including a processing section configured to perform a batch process to a plurality of substrates. The substrate processing apparatus includes: at least one stage each for placing thereon a substrate container having been received from outside the substrate processing apparatus and containing a plurality of substrates; a position adjusting unit of a single substrate processing type configured to adjust a position of the substrate in the rotating direction of the substrate; a first substrate transport mechanism configured to perform a first operation for removing only one of the plurality of substrates contained in the substrate container and transporting the one substrate to the position adjusting unit, and a second operation for transporting, to the substrate container, the one substrate whose position in the rotating direction has been adjusted by the position adjusting unit; and a second substrate transport mechanism configured to perform a collective removal operation for collectively removing, from the substrate container, the plurality of substrates which has been subjected to the first and second operations and whose positions in the rotating direction have been adjusted by the position adjusting unit.

According to the above embodiment, even if substrates are warped, the substrates can be collectively removed from the substrate container easily.

DESCRIPTION OF EMBODIMENTS

Embodiments of the present invention will be described herebelow with reference to the attached drawings.

Figure 1:
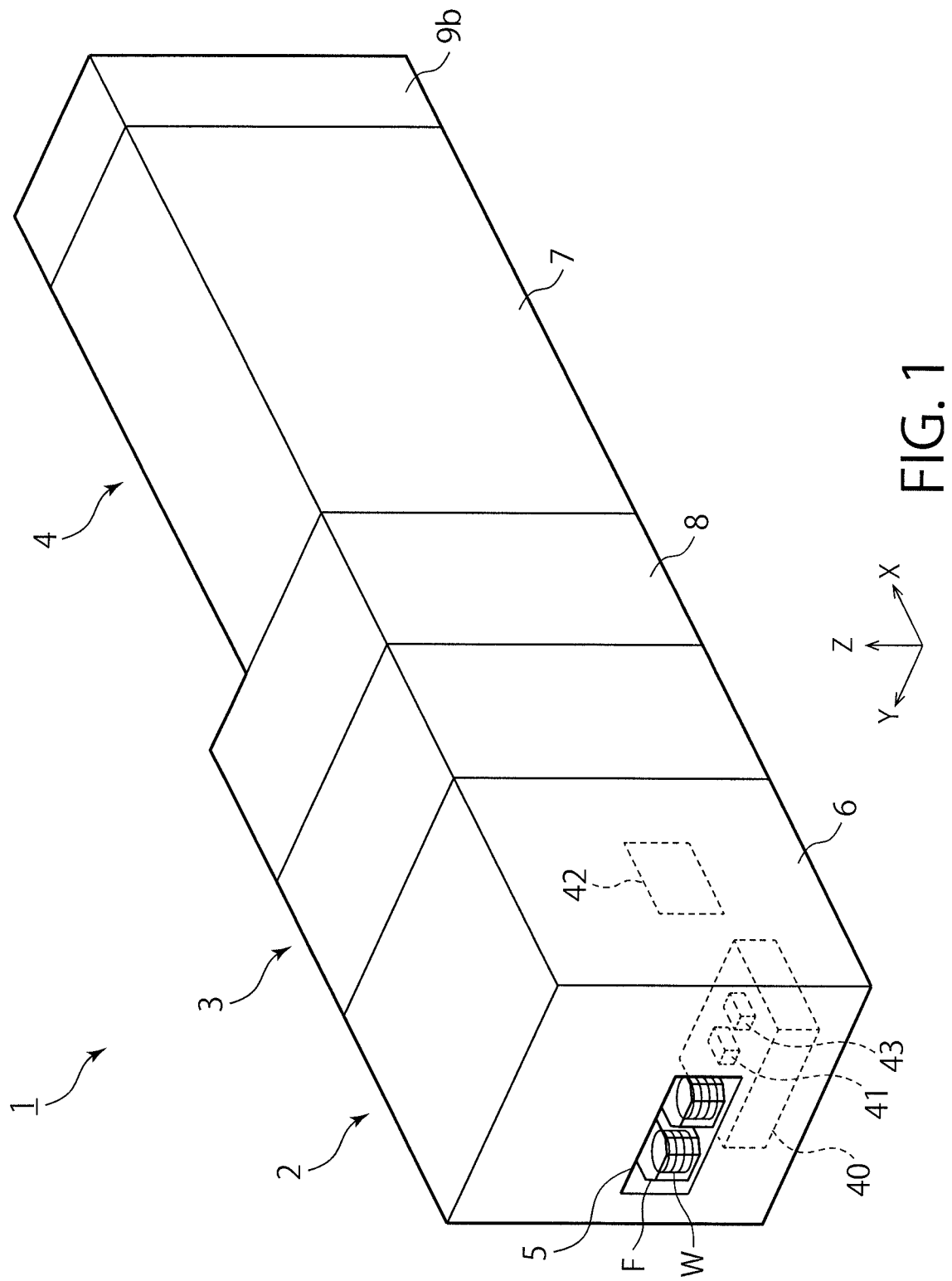
FIG. 1 is a schematic perspective view of a batch type substrate liquid treatment system in one embodiment of a substrate processing apparatus according to the present invention.
Figure 2:
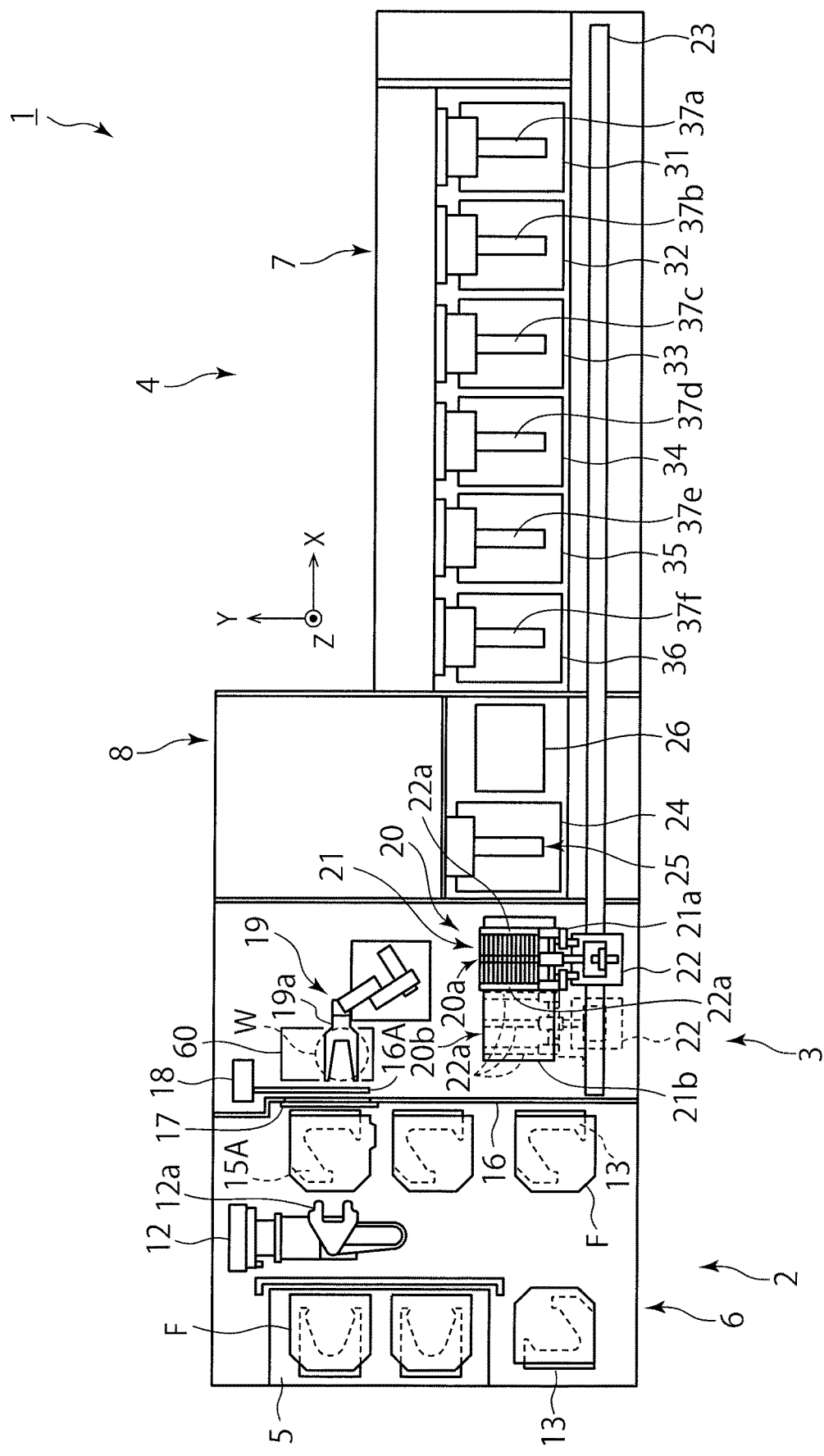
FIG. 2 is a schematic plan view of the substrate liquid treatment system shown in FIG. 1.

As shown in FIGS. 1 and 2, a batch type substrate liquid treatment system 1 in one embodiment of a substrate processing apparatus according to the present invention is roughly divided into a loading and unloading section (2, 3) and a processing section 4 that performs a batch process (liquid treatment) to wafers W (i.e., substrates). The loading and unloading section includes a FOUP handling section 2 in which FOUPs F (Front Opening Unified Pod, i.e., substrate container) each containing wafers W are handled, and a wafer handling section 3 in which the wafers W having been removed from the FOUPs F are handled.

The main tasks of the FOUP handling section 2 includes: receiving FOUPs F from the outside of the substrate liquid treatment system 1; delivering the FOUPs F to the outside of the substrate liquid treatment system 1; and storing the FOUPs F containing wafers W and/or the FOUPs F (vacant) without containing the wafers W.

The main tasks of the wafer handling section 3 includes: removing wafers W from the FOUP F; placing the wafers W thus removed into an arrayed condition suitable for a batch process in the processing section 4; placing the wafers W having been subjected to the batch process in the processing section 4 into an arrayed condition suitable for accommodation in the FOUP F; and accommodating the wafers W into the FOUP F. The term "arrayed condition" herein means at least one of the postures of the wafers W, the intervals of the wafers W, and the wafer arrangement direction.

Namely, the loading and unloading section (2, 3) performs the aforementioned series of operations from the receiving of the FOUPs F from the outside of the substrate liquid treatment system 1 to the placing of the wafers W into the arrayed condition suitable for a batch process performed in the processing section 4, and the operations in the reverse order.

A plurality of (e.g., twenty five) wafers are contained in the FOUP F in horizontal postures at predetermined vertical intervals (i.e., normal pitches). An opening for carrying in and out of the wafers W therethrough is formed in one side of the FOUP F. The opening can be closed by a lid member (not shown). Herebelow, the present embodiment is described on the assumption that twenty five wafers W are contained in one FOUP F. That is, the total number of wafers W contained in two FOUPs F is fifty, and the fifty wafers W form one batch (processing lot).

The FOUP handling section 2 has a FOUP loading/unloading stage 5 on which the FOUP F is placed, and a FOUP stock part 6 in which FOUPs F are stored, and a FOUP transport apparatus 12 (i.e., a container transport mechanism) for transporting the FOUP F.

The FOUP stock part 6 is provided with a plurality of FOUP holding members 13 each of which is capable of holding the FOUP F. The FOUP holding members 13 are arranged at multiple levels (or in multiple rows and at multiple levels) on both sides of a transport area of the FOUP transport apparatus 12. The FOUP stock part 6 (i.e., a storage unit) temporarily stores the FOUP F containing unprocessed wafers W, and temporarily stores the vacant FOUP F from which wafers W are removed.

The FOUP stock part 6 and the wafer handling section 3 are separated by a partition wall 16. The partition wall 16 has two windows, i.e., the upper window 16A and the lower window 16B (only the upper window 16A can be seen in FIG. 2). In the FOUP stock part 6, a wafer loading/unloading stage 15A (i.e., second stage) and a wafer loading/unloading stage 15B (i.e., first stage) are disposed adjacently to the windows 16A and 16B, respectively. Only the upper wafer loading/unloading stage 15A can be seen in FIG. 2. The FOUP F can be placed on the wafer loading/unloading stage 15A, 15B such that the lid member of the FOUP F faces the corresponding window 16A, 16B.

Lid open/close mechanisms 17 are disposed near each of the wafer loading/unloading stages 15A and 15B, in order to open and close the lid member of the FOUP F placed on the corresponding stage. Only the upper lid open/close mechanism 17 can be seen in FIG. 2, and illustration of the open/close mechanisms 17 are omitted in FIG. 3.

The FOUP transport apparatus 12 is comprises an articulated transport robot that transports the FOUP F while supporting the FOUP F by its support arm 12a. The FOUP transport apparatus 12 is movable in X direction (horizontal direction), Y direction (horizontal direction) and Z direction (vertical direction), and thus can transport the FOUP F among the FOUP loading/unloading stage 5, the FOUP holding members 13, and the wafer loading/unloading stages 15A and 15B.

In the wafer handling section 3, wafer inspection apparatuses 18 for inspecting the contained state of wafers W (the number of contained wafers, presence of jump slot, etc.) in the FOUP F are respectively disposed near the windows 16A and 16B.

The wafer handling section 3 is equipped with a collective transport apparatus 19 (i.e., a second substrate transport mechanism), a single-wafer transport apparatus 60 (i.e., a first substrate transport mechanism), a notch aligner 70 (i.e., a position adjusting unit) and a batch forming unit 20. The notch aligner 70 is disposed below the wafer loading/unloading stages 15A and 15B. Thus, the wafer handling section 3 may be deemed to project into the space below the wafer loading/unloading stage 15B of the FOUP handling section 2 in order to install the notch aligner 70.

The collective transport apparatus 19 transports wafers W between the FOUP F placed on the wafer loading/unloading stage 15A and the batch forming unit 20. The collective transport apparatus 19 comprises an articulated robot (or a multiaxis arm robot) having a plurality of wafer holding arms 19a at its distal end. The wafer holding arms 19a is configured to simultaneously hold twenty five wafers W at normal pitches (e.g., 10 mm) which are equal to arrangement pitches at which the wafers W are arranged in the FOUP F. The wafer holding arms 19a can take any positions and any postures in a three-dimensional space without allowing the wafers W held by the wafer holding arms 19a to fall out therefrom.

Figure 3:
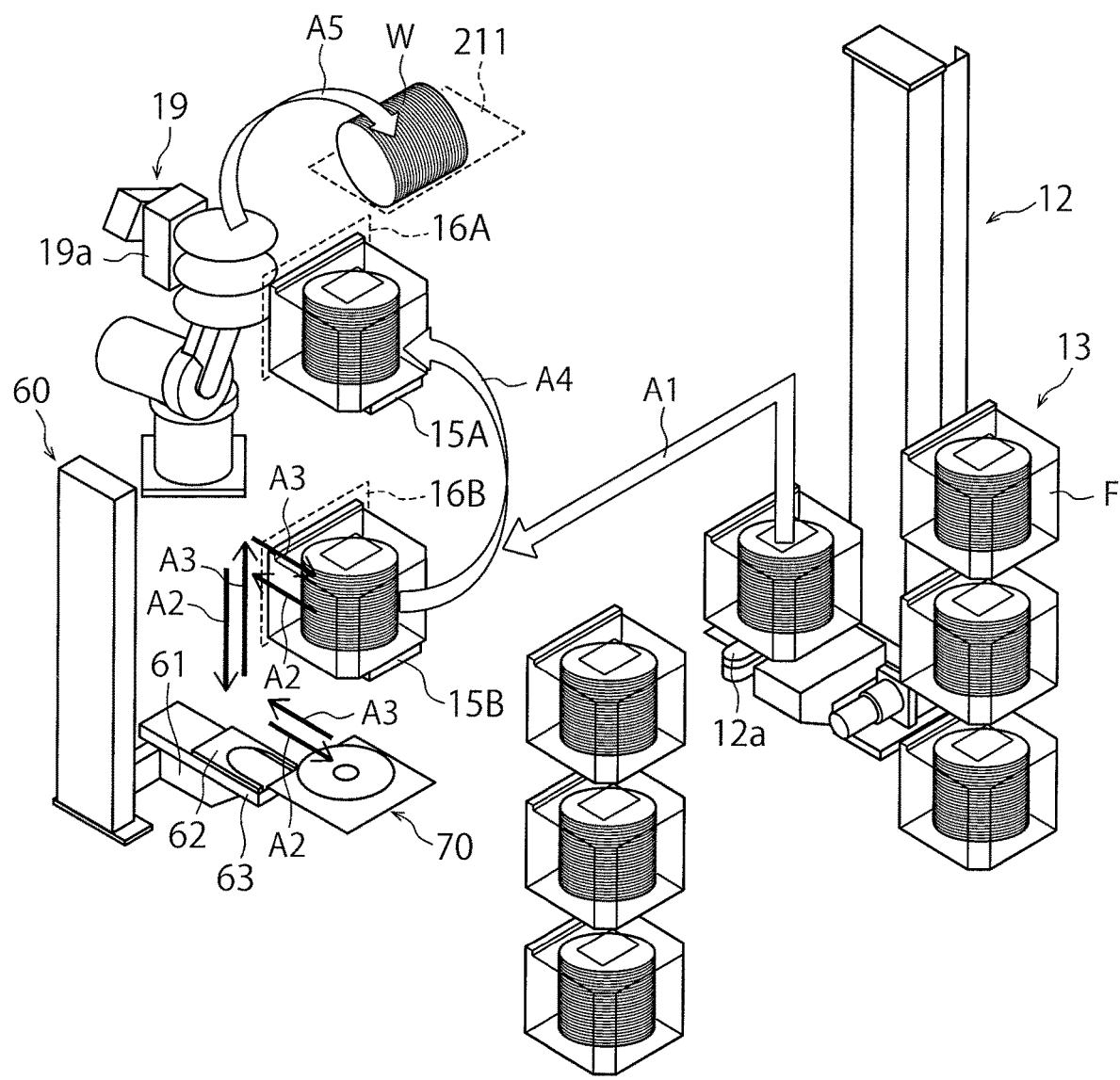
FIG. 3 is a schematic perspective view for explaining transport of FOUPs and transport of wafers in a FOUP handling section and a wafer handling section.

The single-wafer transport apparatus 60 transports the wafers W one by one between a FOUP F on the wafer loading/unloading stage 15B, and the notch aligner 70. As shown in FIG. 3, the single-wafer transport apparatus 60 includes a movable body 61 capable of vertically moving, and wafer holding arms 62 and 63 that can move independently of each other in a back and forth direction with respect to the movable body 61.

The single-wafer transport apparatus 60 can perform operation in which immediately after one vacant wafer holding arm (e.g., 62) removes a wafer W from the notch aligner 70, the other wafer holding arm (e.g., 63) holding another wafer W can put the another wafer W on the notch aligner 70 (the same operation can be made with respect to the FOUP F). Thus, when the single-wafer transport apparatus 60 moves between the FOUP F placed on the wafer loading/unloading stage 15B and the notch aligner 70, the single-wafer transport apparatus 60 always holds one wafer W. Thus, the transport time of the wafer W, and thus the time required for positioning (or aligning) the wafer W by the notch aligner 70 can be reduced.

Figure 4:
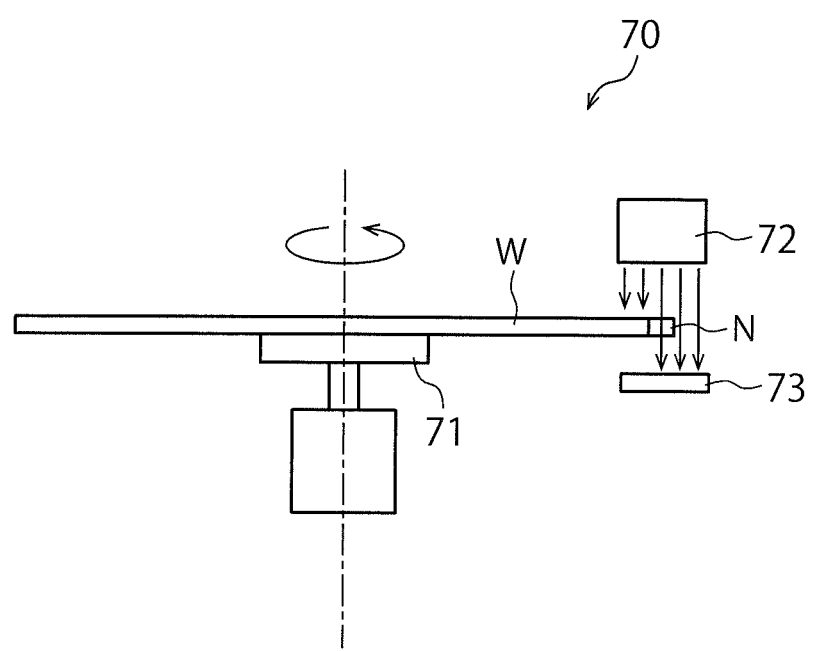
FIG. 4 is a schematic sectional view for explaining the structure of a notch aligner.

As schematically shown in FIG. 4, the notch aligner 70 has a rotary chuck 71 that holds the central portion of the lower surface of the wafer W by suction and rotates the wafer W about a vertical axis, and a line laser sensor 72 (i.e., an inspection light emitting unit and receiving unit) and a reflector plate 73. The line laser sensor 72 and the reflector plate 73 oppose each other, with the peripheral portion of the wafer W being positioned therebetween. The notch aligner 70 detects the position of a notch N based on the change of the quantity of light, which was emitted from the light emitting unit of the line laser sensor 72 and reflected by the reflector plate 73 to enter the light receiving unit of the line laser sensor 72. The notch aligner 70 rotates the rotary chuck 71 based on the detection result such that the notch N is positioned at a specified angular position. The wafer W thus positioned (aligned) is then removed from the single-wafer transport apparatus 60.

The plurality of wafers W are arranged inside the FOUP F at predetermined intervals (normal pitches in this embodiment) and are arranged in parallel in horizontal postures. The collective transport apparatus 19 linearly moves the plurality of wafer holding arms 19a along the surfaces of the wafers W from positions outside the peripheries of the wafers W toward positions corresponding to the central portions of the wafers W, so that each wafer holding arm 19a is inserted through the vertical gap between adjacent wafers W toward the position corresponding to the central portion of the wafer W. By vertically moving each wafer holding arm 19a toward the corresponding wafer W, the wafer W is supported by the corresponding wafer holding arm 19a. If the wafers W are flat, the sizes of the gaps between adjacent wafers W are constant, so that the wafer holding arms 19a can be smoothly inserted into the gap between the adjacent wafers W without colliding against the wafers W.

However, if largely warped wafers W are contained in the FOUP F while randomly oriented, there may be a situation where the peripheral portions of wafers W located near the moving paths of the wafer holding arms 19a are warped down while the peripheral portions of other wafers W located near the moving paths of the wafer holding arms 19a are warped up. Under such a situation, if the plurality of wafer holding arms 19a are moved such that they moves along the wafers W whose peripheral portions are warped down, some of the plurality of wafer holding arms 19a collide with the wafers W whose peripheral portions are warped up. It is thus not possible to remove all the wafers W at the same time. In order to solve the above problem, the present embodiment employs the single-wafer transport apparatus 60 that can avoid the aforementioned collision problem because it transports wafers W one by one, and also employs the notch aligner 70 of the type shown in FIG. 4. This feature will be described later in more detail with reference to FIGS. 9 and 10.

The batch forming unit 20 in the wafer handling section 3 is provided to form and divide a batch (which means a set of fifty wafer W to be processed collectively), to allow carrying-out of the wafers W from the wafer handling section 3 to the processing section 4, and to allow carrying-in of the wafers W from the processing section 4 into the wafer handling section 3. The batch forming unit 20 has a first area 20a in which the formation of the batch and the carrying-out of the wafers W from the wafer handling section 3 to the processing section 4 are performed, and a second area 20b in which the carrying-in of the wafers W from the processing section 4 to the wafer handling section 3 and the dividing of the batch are performed.

The first area 20a and the second area 20b are respectively equipped with a first arrangement mechanism 21a and a second arrangement mechanism 21b. The first arrangement mechanism 21a combines twenty five unprocessed wafers W (first wafers) arranged at the normal pitches, which have been supplied from the collective transport apparatus 19, with other twenty five unprocessed wafers W (second wafers), so as to form a batch consisting of fifty wafers W arranged (arrayed) at half pitches (e.g., 5 mm). The second arrangement mechanism 21b divides the fifty processed wafers W arranged at the half pitches into a first set of twenty five wafers W (first wafers W) and a second set of twenty five wafers W (second wafers W) which are each arranged at the normal pitches.

Figure 5:
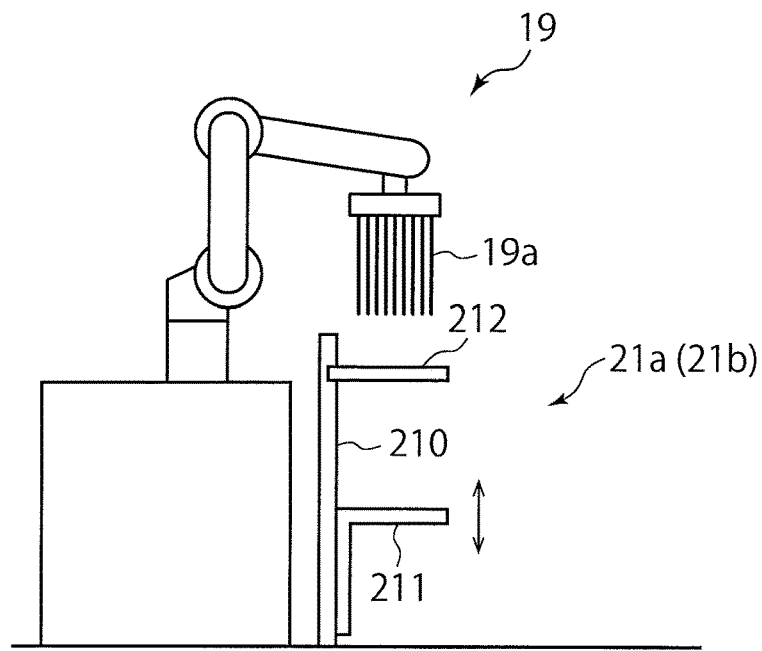
FIG. 5 is a schematic side view for explaining the structure and the operation of a wafer arrangement mechanism.
Figure 6:
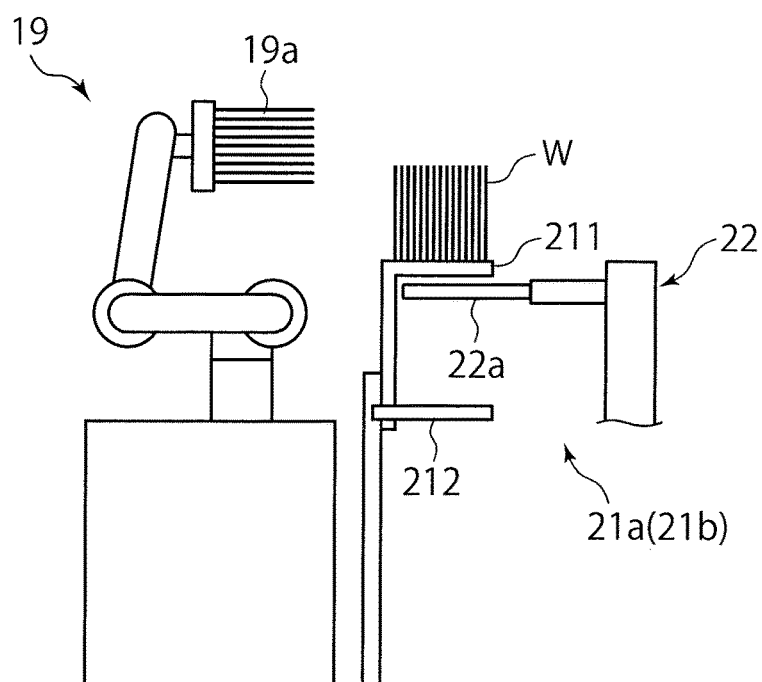
FIG. 6 is a schematic side view for explaining the structure and the operation of the wafer arrangement mechanism.

The first arrangement mechanism 21a and the second arrangement mechanism 21b have the same structure. As shown in FIGS. 5 and 6, each arrangement mechanism 21a, 21b has a guide 210 extending vertically, a wafer hand 211 vertically movable along the guide 210, and a wafer holder 212 fixed to the guide 210. The wafer hand 211 is configured to hold fifty wafers at the half pitches. The wafer holder 212 is configured to hold twenty five wafers W at the normal pitches, and configured to allow the wafer hand 211 to pass through the wafer holder 212 in the vertical direction.

The substrate liquid treatment system 1 further includes a wafer transport apparatus 22 that transports the wafers W between the wafer handling section 3 and the processing section 4. The wafer transport apparatus 22 has three chuck rods 22a. Each chuck rod 22a is provided with fifty (or fifty one or fifty two) wafer holding grooves at the half pitches. Thus, the wafer transport apparatus 22 can hold fifty wafers W that are in upright postures (i.e., posture in which a wafer surface is along the vertical direction) and are horizontally arranged at the half pitches. The wafer transport apparatus 22 can be moved in the X direction (horizontal direction) in FIG. 2 along a guide rail 23 extending horizontally from the wafer handling section 3 to the processing section 4.

The processing section 4 includes a liquid processing unit 7 and a drying unit 8. The wafer transport apparatus 22 moves along the guide rail 23 to transport the wafers W between the liquid processing unit 7 and the drying unit 8.

As shown in FIG. 2, in the liquid processing unit 7, there are disposed a first chemical liquid tank 31, a first rinsing tank 32, a second chemical liquid tank 33, a second rinsing tank 34, a third chemical liquid tank 35 and a third rinsing tank 36, which are arranged in that order from the side away from the wafer handling section 3. These tanks 31, 32, 33, 34, 35 and 36 are provided with wafer holding units 37a, 37b, 37c, 37d, 37e and 37f, respectively.

The wafer holding units 37a to 37f have the same structure. The holding units 37a to 37f can each hold fifty wafers W that are in upright postures and are horizontally arranged at the half pitches (see FIGS. 7 and 8). The wafer holding units 37a to 37f can be vertically moved by respective elevation mechanisms, not shown. Thus, each of the holding units 37a to 37f can collectively transfer, to and from the wafer transport apparatus 22, fifty wafers W which are in upright postures and are horizontally arranged at the half pitches, and can immerse the wafers W held thereon into a processing liquid (treatment liquid) stored in the corresponding tank (31 to 36).

Different kinds of chemical liquids are stored in the first chemical liquid tank 31, the second chemical liquid tank 33 and the third chemical liquid tank 35. The chemical liquids may be various ones such as SPM liquid heated at around 130° C. for removing organic contaminants and surface metal impurities, SC-1 liquid (a mixed solution containing ammonia, hydrogen peroxide solution and water) for removing attachments such as particles, an etching liquid for wet-etching an oxide film formed on the surface of the wafer W (e.g., dilute hydrofluoric acid, buffered hydrofluoric acid (BHF) which is a mixture of hydrofluoric acid and ammonium fluoride), a phosphoric acid solution ($H_3PO_4$aq) heated at about 160 to 180° C. for wet-etching a silicon nitride film, and so on.

The first, second and third rinsing tank 32, 34 and 36 are provided for removing chemical liquids adhering to wafers W by liquid processes (liquid treatments) performed in the first, second and third chemical liquid tanks 31, 33 and 35, respectively. Various rinsing methods, such as an overflow rinsing, a quick damp rinsing, can be used in those tanks 32, 34 and 36.

Figure 7:
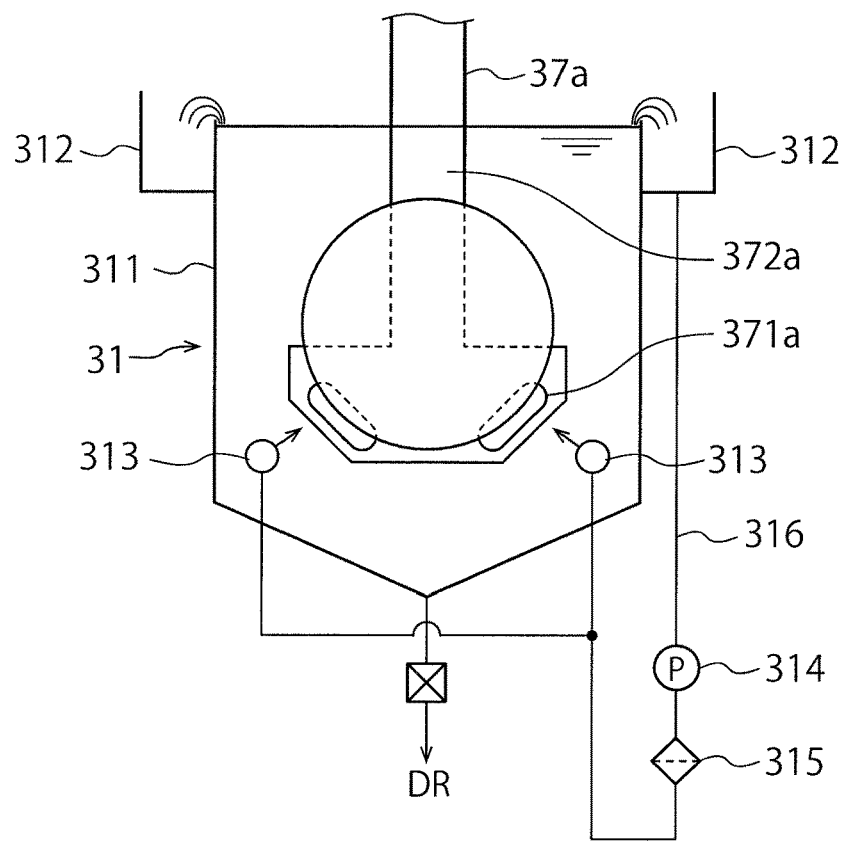
FIG. 7 is a schematic sectional view for explaining the structures of a chemical liquid tank and a mechanism associated therewith.
Figure 8:
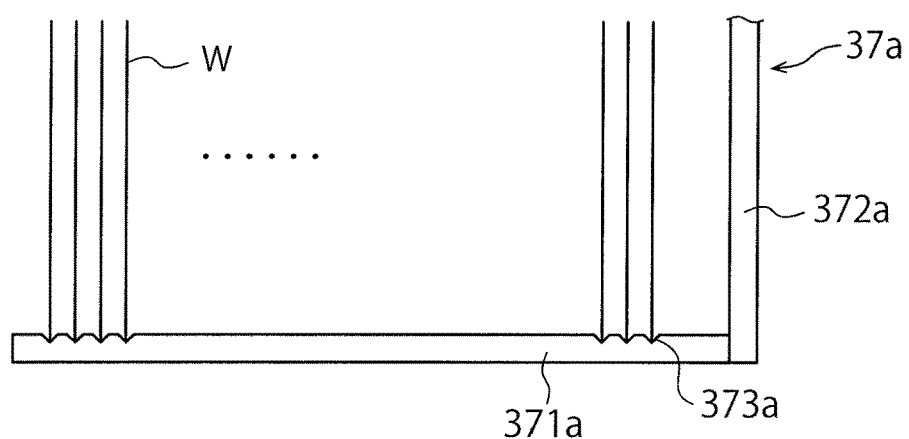
FIG. 8 is a schematic sectional view for explaining the state of wafers in the chemical liquid tank.

The first chemical liquid tank 31, the first rinsing tank 32, the second chemical liquid tank 33, the second rinsing tank 34, the third chemical liquid tank 35 and the third rinsing tank 36 and mechanisms associated with these tanks have substantially the same structures. An example of the structure of the first chemical liquid tank 31 and the associated mechanism is briefly described, as a representative, with reference to FIGS. 7 and 8. The first chemical liquid tank 31 has an inner tank 311 and an outer tank 312. The inner tank 311 is filled with a chemical liquid (processing liquid). The wafer holding unit 37a, which is holding fifty wafers W in upright postures arranged at the half pitches in a direction perpendicular to the sheet plane of FIG. 7, is moved downward so as to be positioned in the chemical liquid stored in the inner tank 311. The chemical liquid is jetted toward the wafers W from nozzles 313, so that the chemical liquid in the inner tank 311 overflows into the outer tank 312. The overflown chemical liquid is fed again to the nozzles 313 via a circulation line 316 provided with a pump 312 and a filter 315. The wafer holding unit 37a has a plurality of, e.g., four wafer holding rods 371a mounted on a base 372a. Fifty (or fifty one or fifty two) wafer holding grooves 373a arranged at the half pitches are formed in each wafer holding rod 371a. Peripheral portions of the wafers W are inserted into the wafer holding grooves 373a in each wafer holding rod 371a.

A rinsing tank 24 and a chuck cleaning mechanism 26 that cleans the chuck rods 22a of the wafer transport apparatus 22 are disposed in the drying unit 8. A drying chamber (not shown) in which the wafers W are dried by means of a dry promotion gas such as isopropyl alcohol (IPA) vapor is disposed above the rinsing unit 8. The drying unit 8 further includes a wafer holding unit 25 having the same structure as that of the aforementioned wafer holding units 37a to 37f. The wafer holding unit 25 can transfer wafers W to and from the wafer transport apparatus 22, and can move vertically so as to move wafers W between the rinsing tank 24 and the not-shown drying chamber.

As schematically shown in FIG. 1, a control unit 40 is disposed in a housing of the FOUP handling section 2. The control unit 40 includes a controller 41 having a microprocessor (MPU) for controlling various mechanisms, units and devices constituting the substrate liquid treatment system 1, a user interface 42 and a storage unit 43 storing information required for processes.

The user interface 42 and the storage unit 43 are connected to the controller 41. The user interface 42 has a keyboard through which an operator inputs a command for managing respective constituent elements of the substrate liquid treatment system 1, and also has a display which visually displays operation conditions of the respective constituent elements of the substrate liquid treatment system 1. The storage unit 43 stores control programs for executing various processes performed by the substrate liquid treatment system 1 under the control of the controller 41, control programs, i.e., recipes for executing predetermined processes by the respective constituent elements of the substrate liquid treatment system 1 in accordance with specified process conditions. The control programs such as recipes are stored in a storage medium in the storage unit 43. The storage medium may be either a fixed one such as a hard disk, or a portable one such as a CDROM, a DVD or a flush memory.

Next, an operation of the substrate liquid treatment system 1 is described. Two FOUPs F each containing twenty five wafers W, which are in horizontal postures and are arranged at the normal pitches, are placed on the FOUP loading/unloading stage 5 by an external transporter. A batch is formed by the fifty wafers W contained in the two FOUPs. Herebelow, for the sake of convenience in explanation, one of the two FOUPs F is referred to as first FOUP F, the other is referred to as second FOUP F, the wafers W contained in the first FOUP F are referred to as first wafers W, and the wafers W contained in the second FOUP F are referred to as second wafers W.

The first FOUP F on the FOUP loading/unloading stage 5 is transported by the FOUP transport apparatus 12 to the wafer loading/unloading stage 15B (see the arrow A1 in FIG. 3). In some cases, the first FOUP F is temporarily stored on the FOUP holding member 13 and is then transported to the stage 15B. The lid open/close mechanism 17 detaches the lid member from the first FOUP F on the wafer loading/unloading stage 15B, and the wafer inspection apparatus 18 inspects the contained state of the wafers W (the number of wafers, presence of jump slot, etc.).

Thereafter, the single-wafer transport apparatus 60 removes, one by one, the first wafers W contained in the first FOUP F on the wafer loading/unloading stage 15B. Each first wafer W is loaded into the notch aligner 70 (see the arrow A2 in FIG. 3). The notch aligner 70 adjusts the position in the rotating direction (angular position) of each first wafer W to a specified position. To be specific, the notch N (see FIG. 9) in the wafer W is positioned at a specified angular position. Then, the single-wafer transport apparatus 60 returns the first wafers W back to the first FOUP F on the wafer loading/unloading stage 15B (see the arrow F3 in FIG. 3). After completion of the adjustment of the positions in the rotating direction of all the wafers W in the first FOUP F, the lid open/close mechanism 17 attaches the lid member to the first FOUP F. Then, the FOUP transport apparatus 12 transports the first FOUP F, containing the wafers W whose positions have been adjusted, from the wafer loading/unloading stage 15B to the wafer loading/unloading stage 15A (see the arrow A4 in FIG. 3).

Following thereto, the lid open/close mechanism 17 detaches the lid member from the first FOUP F on the wafer loading/unloading stage 15A. Then, the wafer holding arms 19a of the collective transport apparatus 19 are inserted into the first FOUP F, and removes the twenty five first wafers W in horizontal postures from the first FOUP F. The collective transport apparatus 19 changes the postures of the first wafers W into the upright postures, and then delivers them to the wafer hand 211 (see the arrow A5 in FIG. 3). At this time, the wafer hand 211 is positioned below the wafer holder 212 (see FIG. 5).

In a manner similar to the above, the second FOUP F is placed on the wafer loading/unloading stage 15B, and the positions of all the second wafers W in the second FOUP F are adjusted by means of the single-wafer transport apparatus 60 and the notch aligner 70. After that, the FOUP transport apparatus 12 transports the second FOUP F from the wafer loading/unloading stage 15B to the wafer loading/unloading stage 15A. Note that the direction in which the second wafers W in the second FOUP F are aligned and the direction in which the first wafers W in the first FOUP F are aligned may be identical to each other or different from each other (described in detail later).

Similarly, the collective transport apparatus 19 removes the twenty five wafers W from the second FOUP F on the wafer loading/unloading stage 15A, and delivers the wafers to the wafer holder 212. Then, the wafer hand 211 is moved upward to pass through the wafer holder 212. When the wafer hand 211 is passing through the wafer holder 212, each second wafer W on the wafer holder 212 are inserted between adjacent first wafers W on the wafer hand 211 so as to be delivered to the wafer hand 211. Thus, the first wafers W and the second wafers W are alternately arrayed, and the wafer hand 211 holds the fifty wafers W at the half pitches. That is, a batch consisting of the fifty wafers W, which are in upright postures and are horizontally arranged at the half pitches, is formed. See FIGS. 5 and 6 about the above operations.

Then, by moving down the wafer hand 211 with the wafer transport apparatus 22 being located at a position immediately below the wafer hand 211 of the first arrangement mechanism 21a holding the fifty wafers W at the half pitches, the wafers W are delivered from the wafer hand 211 to the wafer transport apparatus 22.

Note that each time after completion of the removal of the wafers W from the FOUP F (each of the first and second FOUPs) placed on the wafer loading/unloading stage 15A, the lid open/close mechanism 17 attaches the lid member to the FOUP F, and the vacant FOUP F on the wafer loading/unloading stage 15A is transported by the FOUP transport apparatus 12 to one of the FOUP holding members 13 for temporary storage.

In place of transporting the first FOUP F or the second FOUP F from the wafer loading/unloading stage 15B directly to the wafer loading/unloading stage 15A, the first or second FOUP F may be transported to the FOUP holding member 13 and may be temporarily stored on the FOUP holding member 13. In this case, the following transport control may be performed, for example. That is, at first, the first FOUP F is temporarily stored on the FOUP holding member 13 until the alignment of all the wafers W in the second FOUP F is completed. After completion of the alignment (positioning) of the wafers W in the second FOUP F, the FOUP transport apparatus 12 transports the first FOUP F from the FOUP holding member 13 to the wafer loading/unloading stage 15A, and the collective transport apparatus 19 removes the twenty five first wafers W in horizontal postures from the first FOUP F. Following thereto, the FOUP transport apparatus 12 transports the second FOUP F from the wafer loading/unloading stage 15B directly to the wafer loading/unloading stage 15A. Then, the collective transport apparatus 19 removes the second wafers W in horizontal postures from the second FOUP F.

In an alternative example, the following transport control is possible. That is, at first, the first FOUP F is temporarily placed on the FOUP holding member 13 until the alignment (positioning) of all the wafers W in the second FOUP F is completed. After completion of the alignment of the wafers W in the second FOUP F, the second FOUP F is also temporarily placed on the FOUP holding member 13. After the two FOUPs F are placed on the FOUP holding members 13, the FOUP transport apparatus 12 successively transports the first FOUP F and the second FOUP F from the FOUP holding member 13 to the wafer loading/unloading stage 15A. The collective transport apparatus 19 removes the twenty five first wafers W in horizontal postures from the first FOUP F when it is placed on the wafer loading/unloading stage 15A, and successively removes the twenty five second wafers W in horizontal postures from the second FOUP F when it is placed on the wafer loading/unloading stage 15A.

With the above transport control, the alignment of the wafers W by using the notch aligner 70, which requires a long time, can be progressed or completed during a time period in the wafer processing schedule other than time periods during which the batch formation and the liquid treatment of the wafers are to be performed. Thus, the throughput of the substrate treatment in the whole treatment system can be improved.

The wafer transport apparatus 22 collectively transports the fifty wafers W to the processing section 4. At first, the wafer transport apparatus 22 delivers the wafers W to the wafer holding unit 37a located above the first chemical liquid tank 31 in the liquid processing unit 7. The wafer holding unit 37a moves downward to immerse the wafers W in the chemical liquid stored in the chemical liquid tank 31 for a predetermined period of time. Thereafter, the wafer holding unit 37a moves upward to draw up the wafers W from the first chemical liquid tank 31, and delivers the wafers W to to the wafer transport apparatus 22. Then, the wafer transport apparatus 22 delivers the wafers W to the wafer holding unit 37b located above the first rinsing tank 32. The wafer holding unit 37b moves downward to immerse the wafers W in a rinse liquid stored in the first rinsing tank 32. Thereafter, the wafer holding unit 37b moves upward to draw up the wafers W from the first rinsing tank 32. Then, the wafer holding unit 37b delivers the wafers W to the wafer transport apparatus 22. Thereafter, similarly to the above, the wafers W are delivered to the wafer holding unit 37c so as to be immersed in the chemical liquid stored in the second chemical liquid tank 33 for a predetermined period of time, and then are returned to the wafer transport apparatus 22. After that, the wafers W are delivered to the wafer holding unit 37d so as to be immersed in the rinse liquid stored in the second rinsing tank 34 for a predetermined period of time, and are then returned to the wafer transport apparatus 22. Further, the wafers W are delivered to the wafer holding unit 37e so as to be immersed in the chemical liquid stored in the third chemical liquid tank 35 for a predetermined period of time, and are then returned to the wafer transport apparatus 22. After that, the wafers W are delivered to the wafer holding unit 37f so as to be immersed in the rinse liquid stored in the third rinsing tank 36 for a predetermined period of time, and are then returned to the wafer transport apparatus 22.

It is not necessary for wafers W to be subjected to the liquid treatments in all of the pair of the first chemical liquid tank 31 and the first rinsing tank 32, the pair of the second chemical liquid tank 33 and the second rinsing tank 34, and the pair of the third chemical liquid tank 35 and the third rinsing tank 36. The wafers W may be subjected to liquid treatment(s) in selected only one or more of the pairs. The number of pairs of the chemical liquid tanks and the rinsing tanks is not limited to three, and may be 4 or more, or 2 or less.

The wafer transport apparatus 22 delivers the wafers W, which have been subjected to the liquid treatments in the liquid processing unit 7, to the wafer holding unit 25 of the drying unit 8. The wafer holding unit 25 immerses the wafers W into a rinse liquid stored in the rinsing tank 24 so as to rinse them, and then draws up the wafers W from the rinsing tank 24. Then, the wafer transport apparatus 22 brought the wafers W into the drying chamber, not shown, located directly above the rinsing tank 24. In the drying chamber, a drying process using IPA vapor is performed.

Thereafter, the wafer transport apparatus 22 receives the wafers W from the wafer holding unit 25 of the drying unit 8, and transports the wafers W to the second area 20b of the batch forming unit 20. Then, the wafer hand 211 of the second arrangement mechanism 21b receives the wafers from the wafer transport apparatus 22. During downward movement of the wafer hand 211, twenty five, second wafers W, among the fifty wafers W held on the wafer hand 211, are transferred to the wafer holder 212. Thus, the twenty five first wafers W are held at the normal pitches on the wafer hand 211, while the twenty five second wafers W are held at the normal pitches on the wafer holder 212.

The FOUP transport apparatus 12 places the first vacant FOUP F onto the wafer loading/unloading stage 15A, and the lid open/close mechanism 17 opens the lid member of the first FOUP F. Then, the collective transport apparatus 19 removes the first wafers W from the wafer hand 211, and houses the first wafers W into the first FOUP F in the horizontal postures. Thereafter, the wafer inspection apparatus 18A inspects the contained condition of the first wafers W in the first FOUP F. After the inspection, the lid member of the first FOUP F is attached to the first FOUP F by the lid open/close mechanism 17A. The first FOUP F containing the first wafers W having been subjected the liquid treatment (i.e., cleaning process) is transported by the FOUP transport apparatus 12 to one of the FOUP holding members 13, on which it is stored.

The same operation as the above is performed to the second wafers W on the wafer holder 212. That is, the vacant FOUP F is placed on the wafer loading/unloading stage 15A by the FOUP transport apparatus 12, the collective transport apparatus 19 houses the second wafers W, which is held on the wafer holder 212, into the second FOUP F, and the second FOUP F is transported by the FOUP transport apparatus to another FOUP holding member 13. In this way, a series of steps for processing the fifty wafers W forming one processing lot (batch) is completed. The first and second FOUPs containing the processed wafers are unloaded at suitable timings from the substrate liquid treatment system 1 through the FOUP loading/unloading stage 5.

Figure 9:
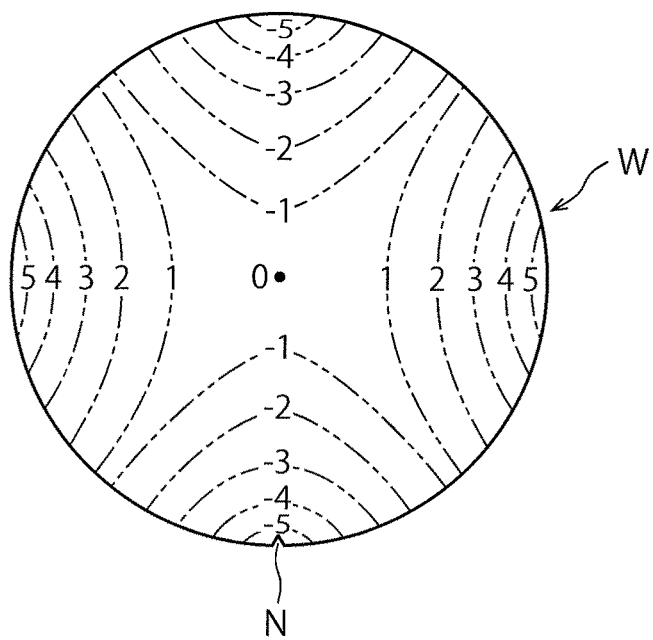
FIG. 9 is a schematic plan view for explaining a warp occurring in a wafer.
Figure 10:
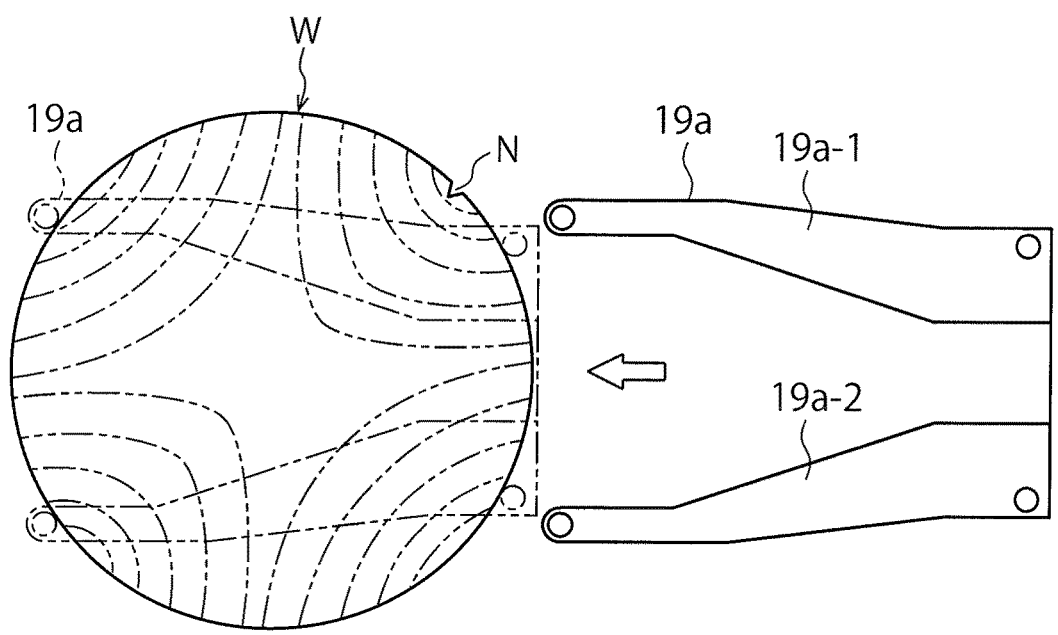
FIG. 10 is a schematic plan view for explaining the operation for taking out of a wafer.

FIG. 9 is a view schematically showing the tendency of warpage of a wafer W, on which 3D-NAND which is a multilayered device is formed, as an example of a warped wafer W. In FIG. 9, contour lines are shown by broken lines. The numerical values are added to the contour lines to schematically indicate height levels of positions on the respective contour lines assuming that the height at the center of the wafer W is zero. The inventors found that, if the structure of the devices formed on wafers W is the same, the same warp (height) distribution is produced with respect to the position of the notch N as the reference position.

If warped wafers W are contained in a FOUP F with their notches N being oriented randomly, there is a possibility that the collective transport apparatus 19 cannot simultaneously take out fifty wafers W from the FOUP F. In order to solve this problem, it is effective to firstly align the positions (orientations) of the notches N of the wafers W contained in the FOUP F. Thus, if the tendency of warpage is the same among the wafers W, the distances between adjacent wafers W becomes substantially uniform at different positions in the plane of the wafers W. It is also effective to adjust the position (orientation) of the wafer W in the rotating (circumferential) direction thereof so as to reduce the projection areas (the larger the warpage is, the larger the projection area is) of portions of the wafer W (as viewed from the moving direction of the wafer holding arm 19a) corresponding to the moving path along which the wafer holding arm 19a of the collective transport apparatus 19 is inserted into the FOUP F. It is also effective to equalize the heights of the portions of wafers W which are located in the moving paths along which the first finger 19a-1 and the second finger 19a-2 (see FIG. 10) of the wafer holding arm 19a of the collective transport apparatus 19 are inserted into a FOUP F.

Incidentally, in a case where largely-warped wafers W are arranged at the half pitches, the gap between adjacent wafers W may be very small at particular position(s) in the plane of each wafer W. The treatment liquid cannot sufficiently pass through such a very small gap between adjacent wafers W near the aforementioned particular position(s). This may result in deterioration of in-plane uniformity of the treatment result.

When the twenty five first wafers W contained in the first FOUP F1 and the twenty five second wafers W contained in the second FOUP F2 are combined so as to form a batch including the fifty wafers W, the below two arrangements is possible.

(Arrangement 1) The wafers W are arranged such that the front surfaces on which device patterns are formed are all directed in the same direction (referred to as "FACE TO BACK" or "BACK TO FACE" arrangement).

(Arrangement 2) The wafers W are arranged to form twenty five pairs of wafers W wherein in each pair the front surfaces on which device patterns are formed (or the back surfaces on which device patterns are not formed) oppose each other (referred to as "BACK TO BACK" or "FACE TO FACE" arrangement).

In the case of Arrangement 1, by aligning the angular positions of the notches N of all the wafers W, the distribution of the gap size between adjacent wafers W in the wafer plane can be made substantially uniform. This can prevent deterioration of the in-plane uniformity of the treatment result. Thus, with the Arrangement 1, the orientations of the notches N can be determined in consideration only of facility in taking out of the wafers W from the FOUP F by the collective transport apparatus 19.

In view of the tendency of the warpage of the wafer W shown in FIG. 9, in the case of the Arrangement 2, it is apparent that the distribution of the gap size between adjacent wafers W in the wafer plane can be made substantially uniform by shifting the angular position of the notch N of each first wafer W and the angular position of the notch N of each second wafer W by 90 degrees. This arrangement improves the in-plane uniformity of the treatment result. In addition, the wafers W can be prevented from coming into contact with each other when the wafer is being transported or being subjected to liquid treatment after batch formation.

In the case of Arrangement 2, it is preferable that the notch aligner 70 adjusts the positions of the wafers W in the rotating direction such that the wafers W are subjected to a liquid treatment with the notch N of each first wafer W being positioned at an angular position rotated clockwise by 45 degrees from an angular position at which the notch N is directed right above, and with the notch N of each second wafer W being positioned at an angular position rotated counterclockwise by 45 degrees from an angular position at which the notch N is directed right above. In this manner, both the facility in taking out of wafers W from the FOUP F by the collective transport apparatus 19 and the in-plane uniformity of the treatment result can be achieved.

The position adjustment of the first and second wafers W in the rotating direction (i.e., adjustment of the orientations of the notches N) by the notch aligner 70 may be automatically performed by the controller 41 based on the recipe stored in the storage unit 43 or a recipe transmitted from a host computer. Alternatively, an operator may specify the positions of the first and second wafers W in the rotating direction through the user interface 42.

There is an existing apparatus having a structure equivalent to the aforementioned substrate liquid treatment system 1 but failing to include the single-wafer transport apparatus 60 and the notch aligner 70. Such an existing apparatus can be modified into an apparatus similar to the aforementioned substrate liquid treatment system 1 by connecting a box shaped unit including the single-wafer transport apparatus 60 and the notch aligner 70.

In the above embodiment, the substrate is a semiconductor wafer W but is not limited thereto. The substrate may be any substrate as long as it has a discoid shape that can be aligned by the notch aligner 70 and it has a warp distribution having a specific positional relationship with respect to the notch.

What is claimed is:

1. A substrate processing apparatus including a processing section configured to perform a batch process to a plurality of substrates, the substrate processing apparatus comprising:
    at least one stage each for placing thereon a substrate container containing a plurality of substrates to be subjected to the batch process in the processing section;
    a position adjusting unit configured to adjust a position of the substrate in the rotating direction of the substrate;
    a first substrate transport mechanism configured to perform a first operation for removing only one of the plurality of substrates contained in the substrate container and transporting the one substrate to the position adjusting unit, and a second operation for removing the one substrate whose position in the rotating direction has been adjusted by the position adjusting unit and transporting the one substrate back to the same substrate container, the first substrate transport mechanism having only two substrate holding arms, each configured to hold only one substrate, wherein the first substrate transport mechanism is configured to perform a pick-and-place operation at least when the second operation is performed, wherein in the pick-and-place operation, one of the only two substrate holding arms removes the one substrate whose position in the rotating direction has been adjusted, from the position adjusting unit, and immediately thereafter another substrate of the plurality of substrates removed from the same substrate container and held by the other of the only two substrate holding arms is transferred to the position adjusting unit;
    a second substrate transport mechanism configured to perform a collective removal operation for collectively removing, from the substrate container, the plurality of substrates which have been subjected to the first and second operations and whose positions in the rotating direction have been adjusted by the position adjusting unit, the second substrate transport mechanism including an arm portion, and a plurality of substrate holders defined at a distal end of the arm portion; and
    a batch forming unit configured to form and divide the plurality of substrates into a batch of the substrates for transfer thereof between the substrate container and the processing section, and comprising at least a first arrangement mechanism configured to combine a first selected number of substrates having a first pitch from the second substrate transport mechanism, prior to processing, and a second arrangement mechanism configured to divide the first selected number of substrates having the first pitch, after processing, into a second selected number of substrates, smaller than the first selected number, having a second pitch different from the first pitch,
    wherein the second substrate transport mechanism is configured to remove the plurality of substrates from the substrate container in a substantially horizontal orientation, change the orientation of the plurality of substrates to a substantially vertical orientation, and deliver the plurality of substrates to the batch forming unit in the substantially vertical orientation.

2. The substrate processing apparatus according to claim 1, further comprising a control unit configured to control the position adjusting unit, the first substrate transport mechanism and the second substrate transport mechanism so as to make the position adjusting unit and the first substrate transport mechanism perform the first operation and the second operation on each of the plurality of substrates contained in the substrate container, and thereafter make the second substrate transport mechanism perform the collective removal operation.

3. The substrate processing apparatus according to claim 1, wherein:
    the at least one stage includes a first stage on which the substrate container is placed when the first substrate transport mechanism removes the substrate from the substrate container; and
    the first stage and the position adjusting unit are arranged in a vertical direction.

4. The substrate processing apparatus according to claim 1,
    wherein the at least one stage includes:
    a first stage on which the substrate container is placed when the first substrate transport mechanism removes the only one substrate from the substrate container; and
    a second stage on which the substrate container is placed when the second substrate transport mechanism removes the substrates from the substrate container,
    said substrate processing apparatus further comprising a container transport mechanism that transports the substrate container between the first stage and the second stage.

5. The substrate processing apparatus according to claim 4, wherein the first stage and the second stage are arranged in the vertical direction.

6. The substrate processing apparatus according to claim 4, the first stage and the position adjusting unit are arranged in a vertical direction.

7. The substrate processing apparatus according to claim 4, further comprising:
    a storage unit configured to temporarily store the substrate container containing the plurality of substrates whose directions in the rotating direction have been adjusted;
    a control unit configured to control operations of the substrate processing apparatus such that a first substrate container is stored in the storage unit and the positions in the rotating direction of the substrates contained in a second substrate container are adjusted, thereafter, the container transport mechanism transports the first substrate container from the storage unit to the second stage and then the second substrate transport mechanism collectively removes the substrates from the first substrate container, and subsequently, the substrate transport mechanism transports the second substrate container from the first stage to the second stage, and the second substrate transport mechanism collectively removes the substrates from the second substrate container.

8. The substrate processing apparatus according to claim 4, further comprising:
    a storage unit configured to temporarily store the substrate containers each containing the plurality of substrates whose directions in the rotating direction have been adjusted;
    a controlling section configured to control operations of the substrate processing apparatus such that after the two substrate containers are stored in the storage unit, the container transport mechanism successively transports the two substrate containers from the storage unit to the second stage, and the second substrate transport mechanism successively performs the operations each for collectively removing the substrates from each of the two substrate containers.

9. The substrate processing apparatus according to claim 1, wherein the processing section includes a substrate holding unit configured to collectively hold the plurality of substrates having been collectively removed from the substrate container by the second substrate transport mechanism, and a processing tank configured to store a treatment liquid therein, wherein the plurality of substrates is immersed in the treatment liquid with the substrate being held by the substrate holding unit.

10. The substrate processing apparatus according to claim 9, the substrate holding unit is configured to hold the plurality of substrates referred to as first substrates having been removed from the substrate container referred to as a first container, and the plurality of substrates referred to as second substrates having been removed from the substrate container referred to as a second container, with the first and second substrates being arranged alternately.

11. The substrate processing apparatus according to claim 10, further comprising a substrate arrangement mechanism configured to combine the first and second substrates such that each second substrate is inserted between adjacent first substrates, thereby to form a batch of the substrates in which the first and second substrates are arranged alternately.

12. The substrate processing apparatus according to claim 11, wherein the position adjusting unit is a notch aligner configured to adjust orientation of a notch formed in a peripheral portion of the substrate, said substrate processing apparatus further comprising a control unit configured to control the position adjusting unit such that the position adjusting unit directs the notches of the first substrates in the same direction and directs the notches of the second substrates in the same direction, wherein the direction of the notches of the first substrates and the direction of the notches of the second substrates are identical to each other or different from each other.

13. The substrate processing apparatus according to claim 1, wherein the first substrate transport mechanism includes a movable body configured to move between a first place in front of the substrate container placed on the stage and a second place in front of the position adjusting mechanism, and wherein said only two substrate holding arms mounted to the movable body so as to be movable independently from each other relative to the movable body such that the first substrate transport mechanism can perform said pick-and-place operation.

* * * * *